US008508306B2

(12) United States Patent  
Choe et al.

(10) Patent No.: US 8,508,306 B2  
(45) Date of Patent: Aug. 13, 2013

(54) RELAXATION OSCILLATOR

(75) Inventors: Andrew Kunil Choe, Singapore (SG); Minkyu Je, Singapore (SG); Bernal Oliver Daniel, Singapore (SG); David Nuttman, Bnei-Brak (IL)

(73) Assignees: Agency for Science, Technology, and Research, Singapore (SG); Physical Logic AG (CH)

( * ) Notice: Subject to any disclaimer, the term of this patent is extended or adjusted under 35 U.S.C. 154(b) by 60 days.

(21) Appl. No.: 13/063,866

(22) PCT Filed: Sep. 19, 2008

(86) PCT No.: PCT/SG2008/000359
§ 371 (c)(1),
(2), (4) Date: May 6, 2011

(87) PCT Pub. No.: WO2010/033079
PCT Pub. Date: Mar. 25, 2010

(65) Prior Publication Data
US 2012/0126906 A1  May 24, 2012

(51) Int. Cl.
*H03K 3/03* (2006.01)
(52) U.S. Cl.
USPC ........................................... 331/143; 331/111
(58) Field of Classification Search
USPC .................................. 331/111, 143
See application file for complete search history.

(56) References Cited

U.S. PATENT DOCUMENTS

| | | | |
|---|---|---|---|
| 1,921,476 | A | 8/1933 | Page |
| 3,320,434 | A | 5/1967 | Ott |
| 3,873,853 | A | 3/1975 | Ahmed |
| 4,260,959 | A | 4/1981 | Allgood |
| 4,413,238 | A | 11/1983 | Pace |
| 4,607,238 | A | 8/1986 | Kohsiek |
| 5,565,819 | A | 10/1996 | Cooper |
| 5,594,388 | A | 1/1997 | O'Shaughnessy et al. |
| 6,020,792 | A * | 2/2000 | Nolan et al. ................. 331/111 |
| 6,356,161 | B1 | 3/2002 | Nolan et al. |
| 6,614,313 | B2 | 9/2003 | Crofts et al. |
| 6,924,709 | B2 | 8/2005 | Bashar |
| 7,109,804 | B2 | 9/2006 | Mader et al. |

FOREIGN PATENT DOCUMENTS

EP  1653617 A1  5/2006

* cited by examiner

*Primary Examiner* — Joseph Chang  
(74) *Attorney, Agent, or Firm* — King & Spalding LLP

(57) ABSTRACT

A relaxation oscillator and a method for offset cancellation in a relaxation oscillator. The relaxation oscillator comprises two comparator units, each comparator unit comprising a comparator element and a memory element; and a switch control generator coupled to each of the comparator units; wherein each comparator unit, in a reset state, stores an input-offset voltage on the memory element under the control of the switch control generator such that, in a comparison state, the input-offset voltage is applied to both inputs of the comparator for implementing an offset-free threshold.

17 Claims, 10 Drawing Sheets

RELAXATION OSCILLATOR

FIELD OF INVENTION

The present invention relates broadly to a relaxation oscillator, and to a method for offset cancellation in a relaxation oscillator.

BACKGROUND

In a complementary metal-oxide-semiconductor (CMOS) integrated-circuit (IC) systems with extreme constrains on area and power consumption, a monolithic implementation of clock oscillator is essential.

A ring of digital logic gate with negative feed-back, (e.g. ring oscillator) is one of the possible monolithic implementation of an oscillator, and the oscillation frequency is inversely proportional to the sum of each logic gates' delay. The oscillation frequency range can cover from a few mega-hertz to giga-hertz. However, the ring oscillator suffers from huge deviation in its oscillation frequency as environmental conditions change. Therefore, the ring oscillator is almost always used with a frequency locking system such as phase-locked loop where an external reference clock is required.

For a mid-to-high frequency range, inductor-capacitor (LC) tuned oscillator is a popular choice for a time reference. Since both inductors and capacitors do not generate any intrinsic noises, the LC tuned oscillator has one of the best frequency stability. However, although modern CMOS fabrication process provides well-controlled on-chip inductance, inductors occupy significant die area that is sometimes not acceptable for an area-limited application. This becomes worse as the target oscillation frequency goes low because of the inverse proportionality between inductance and the oscillation frequency.

For a low-to-mid frequency range, a resistor-capacitor (RC) pair is another choice for a time reference. Relaxation oscillator is one of the most widely studied and implemented oscillators that utilize readily available RC time reference on a CMOS fabrication process. Since a large RC time constant can be implemented on chip more readily than a large LC value, this oscillator occupies smaller area than LC tuned oscillator. However, monolithic relaxation oscillator circuits also suffer from large errors in oscillation period due to process and temperature variation. Beside the capacitance and resistance, the threshold value of a threshold device is also affected by process and temperature variations. An automatic offset canceling technique can be used in order to compensate for the threshold variation. However, since offset canceling techniques are based on switched-capacitor circuits, offset canceling requires an additional clock signal.

In a relaxation oscillator, a capacitor is periodically charged and discharged by a resistor (or a current source). The timing when to switch between charging and discharging is provided by threshold devices, e.g. CMOS comparators. The oscillation period is directly proportional to the capacitance-resistance product (or capacitance-to-current ratio).

Process variation affects the absolute value of the capacitance-resistance product and may cause errors as large as ±25%. However, this error can be significantly reduced if on-chip calibration for the capacitor (or resistor) is employed. Temperature variation commonly causes an increase of the capacitance-resistance product as temperature rises. This variation can be compensated for by device with a complementary temperature dependency.

A need therefore exists to provide a relaxation oscillator that seeks to address at least one of the above-mentioned problems.

SUMMARY

In accordance with a first aspect of the invention, there is provided a relaxation oscillator comprising two comparator units, each comparator unit comprising a comparator element and a memory element; and a switch control generator coupled to each of the comparator units; wherein each comparator unit, in a reset state, stores an input-offset voltage on the memory element under the control of the switch control generator such that, in a comparison state, the input-offset voltage is applied to both inputs of the comparator for implementing an offset-free threshold.

The memory elements may comprise capacitors.

Each comparator unit may comprise an AND element coupled at respective inputs to an output of the comparator and to the switch control generator respectively, and at an output to a memory block; such that the output of the comparator is decoupled from an input of the memory block in the reset state, and coupled to the input of the memory block in the comparison state under the control of the switch signal generator.

The memory block may provide clock signals to the switch control generator based on current states of the comparator units.

The memory block may comprise an RS flip-flop.

Each comparator may comprise a feedback switchable under the control of the switch control generator such that the feedback is active in the reset state.

Each comparator unit may further comprise a switch coupled to the switch control generator, for charging of the memory element from a reference voltage, including the input-offset voltage, in the reset state.

The switch control generator may comprise a RS flip-flop with multiple delay stages along each feedback path.

In accordance with a second aspect of the invention, there is provided a method for offset cancellation in a relaxation oscillator, the method comprising the steps of for each of two comparators, storing an input-offset voltage on a memory element in a reset phase; and applying, in a comparison phase, a reference voltage, including the input-offset voltage, at a first input of the respective comparators and simultaneously applying the input-offset voltage from the memory element at a second input of the respective comparators for implementing an offset-free threshold.

The method may further comprise decoupling an output of the respective comparators from an input of a memory block in the reset phase, and coupling the output to the input of the memory block in the comparison phase.

The method may further comprise implementing a time delay between decoupling the output of the comparators from the input of the memory block, and entering the reset state for the respective comparators.

The method may further comprise implementing a time delay between entering the comparison state for the respective comparators, and coupling the outputs of the respective comparators to the input of the memory block.

The amount of delay may be controlled by a selected number of delay stages in a switch control generator of the relaxation oscillator.

The memory block may provide clock signals for generating switch control signals based on current states of the comparators.

The method may further comprise applying a feedback across the respective comparator in the reset phase.

The method may comprise charging of the memory element from a reference voltage, including the input-offset voltage, in the reset state.

The switch control generator may comprise a RS flip-flop with two delay stages along each feedback path.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The example embodiments described can provide for cancelling errors in the oscillation period due to comparator input-offset voltages, without the need for external signals the example embodiments compensate for the threshold variation with self-clocked offset cancelling comparators.

Before description of the example embodiments, in the following a conventional implementation of a relaxation oscillator will be described with reference to FIG. 1.

Figure 1:
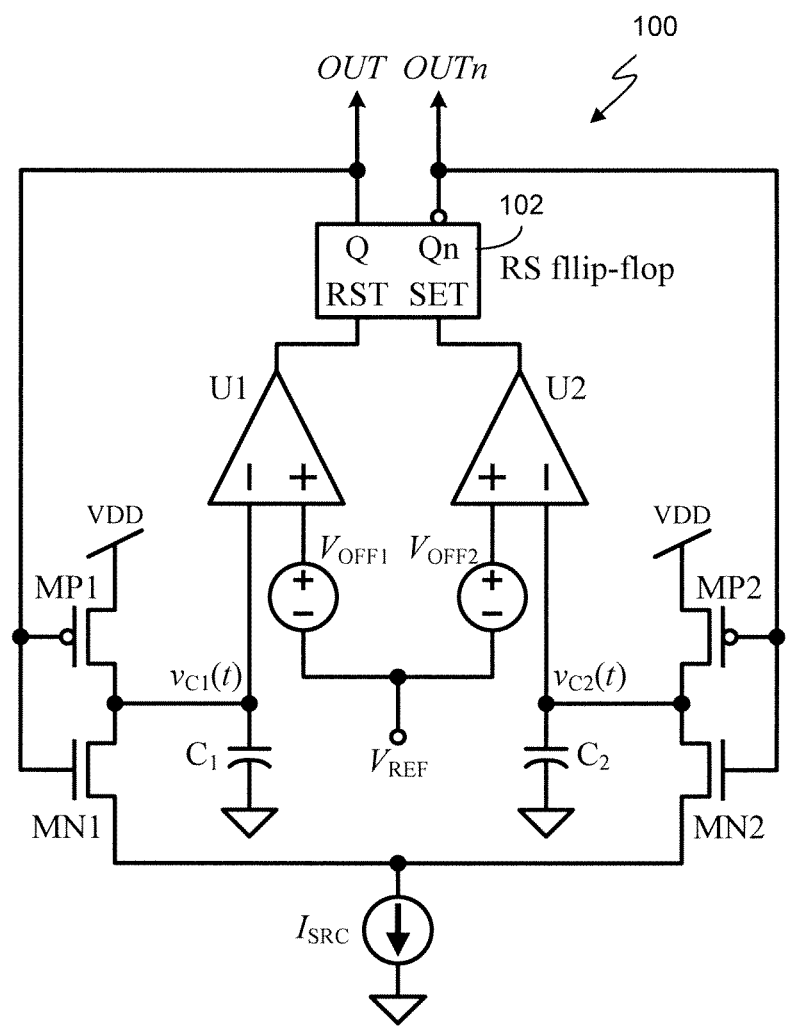
FIG. 1 shows a schematic circuit diagram illustrating a conventional implementation of a relaxation oscillator.

FIG. 1 shows a conventional implementation of a relaxation oscillator 100. The two capacitors, $C_1$ and $C_2$ are alternately charged and discharged depending on the state of the RS flip-flop 102. The input-referred offset voltage of the comparators, U1 and U2 are modeled as $V_{OFF1}$ and $V_{OFF2}$, respectively.

Assume that, at time t=0, $C_1$ is charged to VDD. Also assume that the RS flip-flop is in the set state at t=0. This state causes transistor MN1 to be turned on while MP1 is turned off; the voltage across $C_1$, $v_{C1}(t)$ decreases, starting from $v_{C1}(0)$=VDD, as $C_1$ is discharged by the constant current source, $I_{SRC}$. If we denote the time duration when the RS flip-flop is in the set state as $\tau_H$, $v_{C1}(t)$ is found out to be as follows.

$$v_{C1}(t) = v_{C1}(0) - \frac{1}{C_1}\int_0^t I_{SRC} dt \quad (1)$$
$$= VDD - \frac{I_{SRC}}{C_1} \cdot t$$

for $0 \le t < \tau_H$.

At the same time, MP2 is turned on while MN2 is off. This makes $C_2$ to be clamped to VDD. Thus the output of U2 is held low.

While continuously compared by U1, $v_{C1}(t)$ reaches the trip point of U1, i.e. $V_{REF}+V_{OFF1}$ at t=$\tau_H$ then the output of U1 goes high causing the RS flip-flop 102 to transit to the reset state. $\tau_H$ can be found by letting t=$\tau_H$ and $v_{C1}(t)$=$V_{REF}$+$V_{OFF1}$ into (1) and solving it for $\tau_H$ as follows.

$$\tau_H = \frac{C_1}{I_{SRC}}(VDD - V_{REF} - V_{OFF1}). \quad (2)$$

The transition of the RS flip-flop 102 to the reset state causes MP1 to be turned on while MN1 is turned off. Then $v_{C1}(t)$ is rapidly increased back to VDD making the output of U1, i.e. the RST input of the RS flip-flop 102 to be low again. At the same time, MN2 is turned on while MP2 is turned off. The voltage across $C_2$, $v_{C2}(t)$ decreases as $C_2$ is discharged by $I_{SRC}$. Since $C_2$ was charged to VDD during the previous state of the RS flip-flop 102, $v_{C2}(t)$ starts from VDD. If we denote the time duration when the RS flip-flop 102 is in the reset state as $\tau_L$, $v_{C2}(t)$ during the reset state is defined as follows.

$$v_{C2}(t) = VDD - \frac{I_{SRC}}{C_2} \cdot t \quad (3)$$

for $\tau_H \le t < (\tau_H + \tau_L)$.

While continuously compared by U2, $v_{C2}(t)$ reaches the trip point of U2, i.e. $V_{REF}+V_{OFF2}$ at t=$\tau_H$+$\tau_L$. $\tau_L$ can be found by letting t=$\tau_H$+$\tau_L$ and $v_{C2}(\tau_H+\tau_L)$=$V_{REF}$+$V_{OFF2}$ into (3) and solving it for $\tau_L$ as follows.

$$\tau_L = \frac{C_2}{I_{SRC}}(VDD - V_{REF} - V_{OFF2}). \quad (4)$$

At t=$\tau_H$+$\tau_L$, the output of U2 goes high causing the RS flip-flop to be set again, and completing an oscillation cycle. Therefore, the oscillation period of the relaxation oscillator 100, $t_{OSC}$ is given as follows.

$$t_{OSC} = t_H + t_L \quad (5)$$
$$= \frac{C_1 + C_2}{I_{SRS}}(VDD - V_{REF}) + \frac{C_1}{I_{SRC}}V_{OFF1} + \frac{C_2}{I_{SRC}}V_{OFF2}.$$

Figure 2:
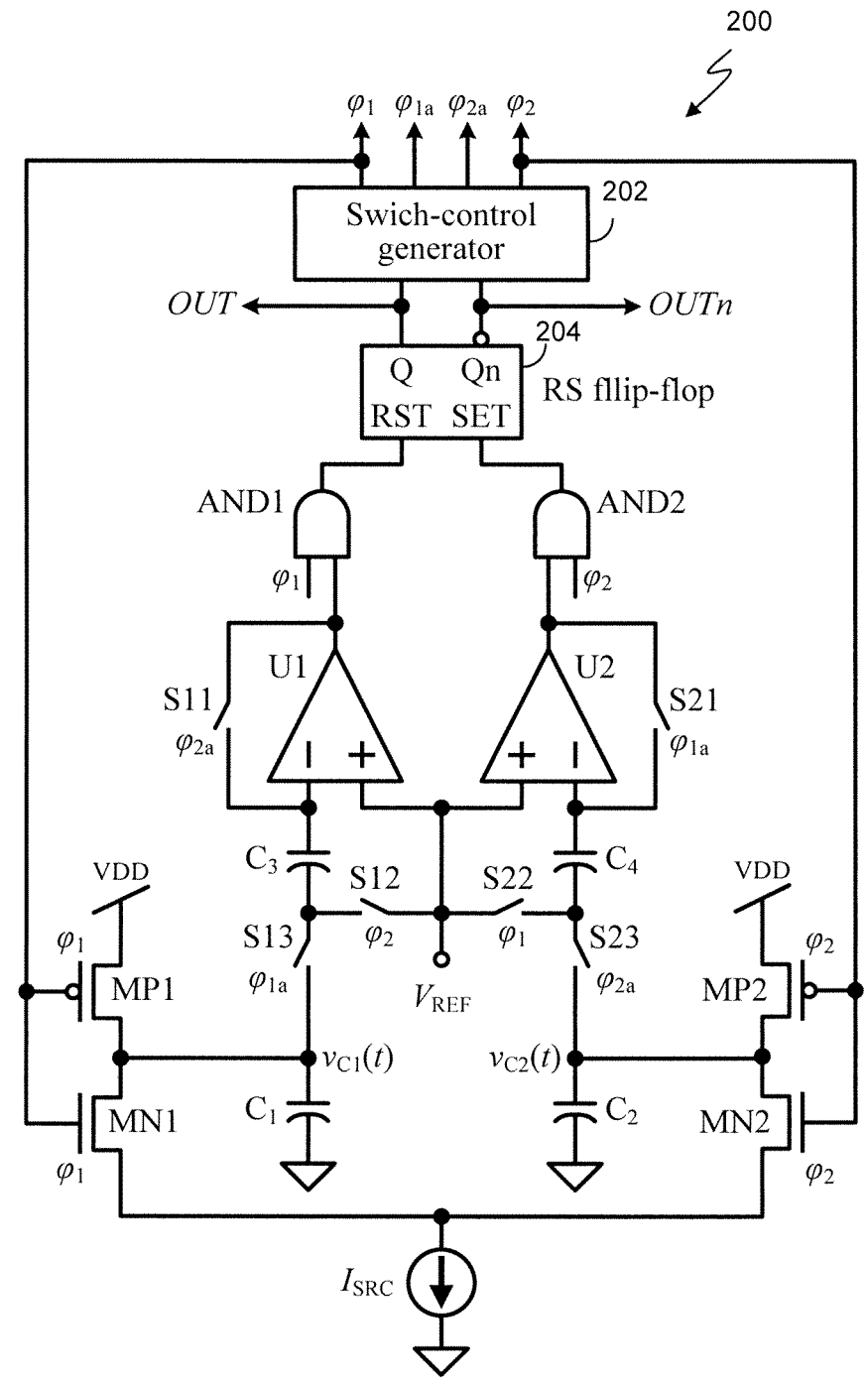
FIG. 2 shows a schematic circuit diagram of a relaxation oscillator according to an example embodiment.

FIG. 2 shows a schematic diagram of a relaxation oscillator 200 according to an example embodiment. $C_3$ and $C_4$ are added in addition to $C_1$ and $C_2$ to store and cancel out the input-offset voltage of each comparator U1 and U2. A switch-control generator 202 is added to generate $\phi_1$, $\phi_{1a}$, $\phi_2$ and $\phi_{2a}$.

Figure 3:
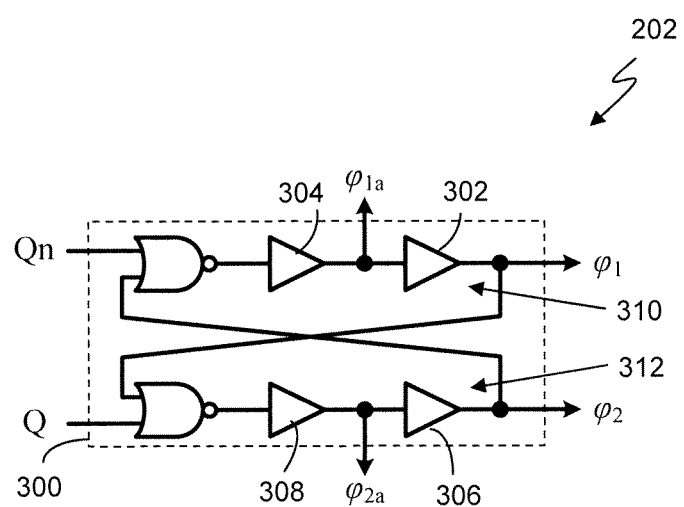
FIG. 3 shows a schematic circuit diagram of a switch-control generator according to an example embodiment.
Figure 4:
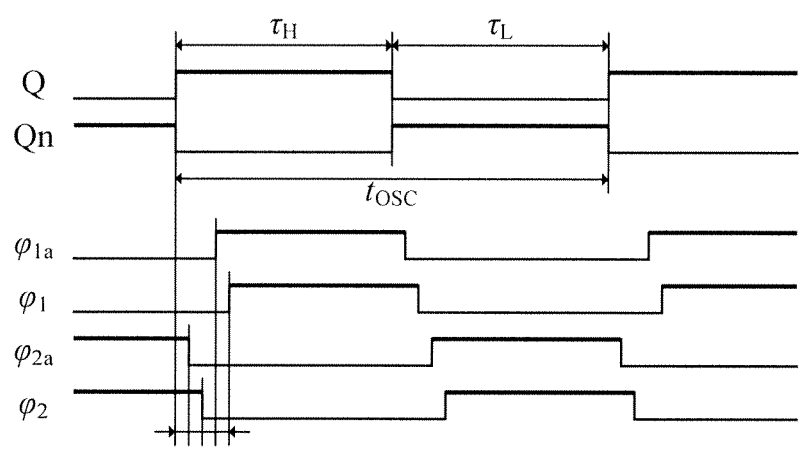
FIG. 4 shows graphs illustrating the input-output signal-timing diagram, according to an example embodiment.

FIG. 3 shows a circuit diagram of the switch-control generator 202 and FIG. 4 shows the input-output signal-timing diagram 400 of the switch-control generator 102. The switch-control generator 202 comprises a RS flip-flop 300 where two delay stages 302, 304 and 306, 308 are placed along each feedback path 310, 312. As shown in FIG. 4, $\phi_1$ and $\phi_{1a}$ do not overlap with $\phi_2$ and $\phi_{2a}$. Also note that $\phi_{1a}$ and $\phi_{2a}$ turn on-and-off slightly earlier than $\phi_1$ and $\phi_2$, respectively. With reference to FIG. 2, S11 and S21 are controlled by $\phi_{2a}$ and $\phi_{1a}$, respectively. By turning off S11 and S21 earlier than S12 and S22, charge injections from S12 and S22 can advantageously be reduced.

It is understood in the art to employ cascaded offset cancelling comparator(s) in order to further reduce charge injections. Assuming that there are two cascaded offset cancelling comparators and let $\phi_{1b}$ and $\phi_{2b}$ be the feedback control signals for the additional comparator. In this case, $\phi_{1b}$ and $\phi_{2b}$ should be turned on-and-off slightly later than $\phi_{1a}$ and $\phi_{2a}$ but earlier than $\phi_1$ and $\phi_2$. One can readily generate $\phi_{1b}$ and $\phi_{2b}$ by using one more delay stage along each feedback path 310, 312. This can be expanded to n-stages of cascaded comparator(s) with n+1 delay stages.

Figure 5:
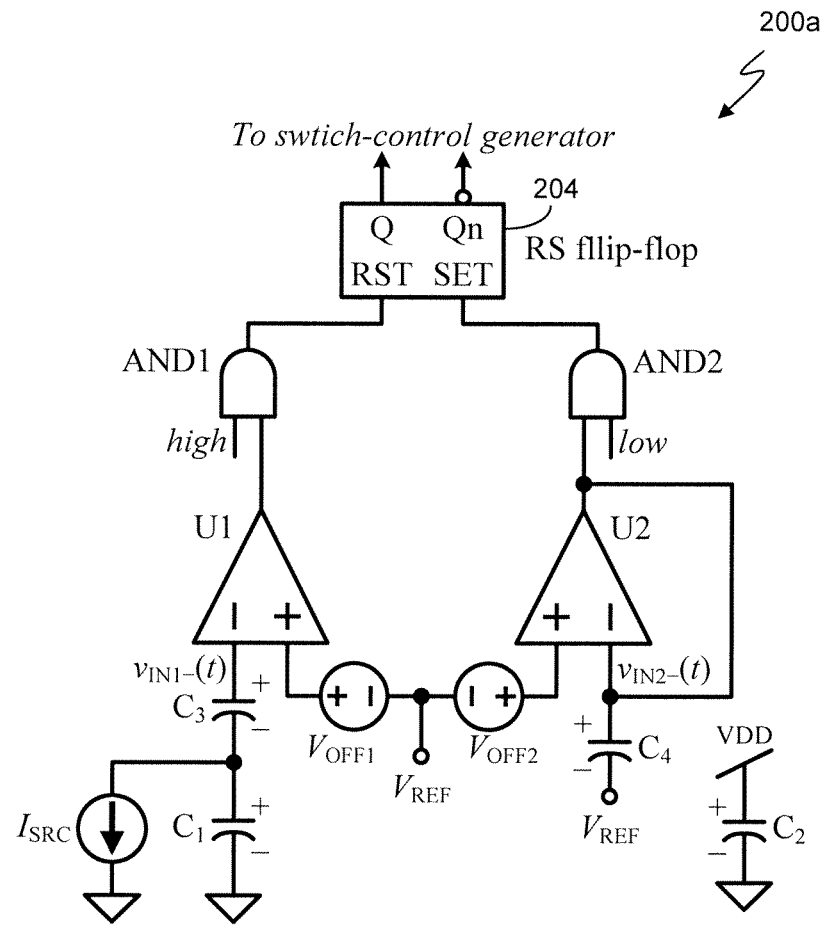
FIG. 5 shows a schematic circuit diagram of only the activated connections of the relaxation oscillator according to an example embodiment in the set stage.

FIG. 5 shows only the activated connections of the relaxation oscillator 200a when the RS flip-flop is in the set state, i.e. $Q=\phi_1=\phi_{1a}$=high while $Qn=\phi_2=\phi_{2a}$=low. Both U1 and U2 have an input-offset voltage error that is modelled by $V_{OFF1}$ and $V_{OFF2}$, respectively. It is assumed that $C_1$ is initially charged to VDD and $C_3$ to $V_{OFF1}$. The voltage across $C_1$, $v_{C1}(t)$ decreases linearly as $C_1$ is being discharged by the constant current source, $I_{SRC}$. The voltage at the inverting input of U1, $v_{IN1-}(t)$ is given by $v_{C1}(t)+V_{C3}$ where $V_{C3}$ denotes the voltage across $C_3$. Since $V_{C3}$ is assumed to be $V_{OFF1}$, U1 compares $v_{IN1-}(t)=v_{C1}(t)+V_{OFF1}$ with $V_{REF}+V_{OFF1}$ cancelling out $V_{OFF1}$. On the other hand, the voltage across $C_2$, $V_{C2}(t)$ is clamped to VDD. The voltage at the inverting input of U2, $v_{IN2-}(t)$ is given by $V_{REF}+V_{OFF2}$ due to the negative feedback across U2. Since the bottom-side of $C_4$ is connected to $V_{REF}$, $C_4$ is charged to $V_{OFF2}$. An AND gate, AND2, is inserted between U2 and the RS flip-flop 202. During $\phi_2$=low, U2 is disconnected from the SET input of the RS flip-flop. This is to prevent the RS flip-flop from being set by the output of U2 when U2 is in the follower configuration.

Figure 6:
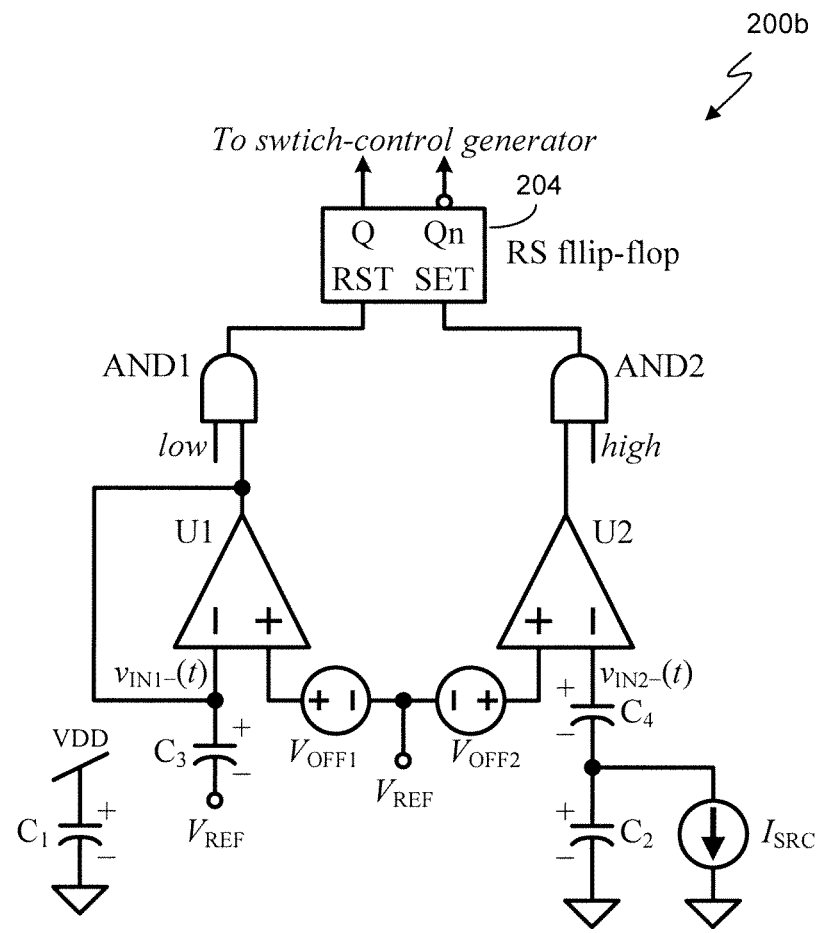
FIG. 6 shows a schematic circuit diagram of only the activated connections of the relaxation oscillator according to an example embodiment in the reset stage.

Once the output of U1 is asserted high, the RS flip-flop 204 proceeds to the reset state. FIG. 6 shows only the activated connections of the relaxation oscillator 200b in the reset state, i.e. $Q=\phi_1=\phi_{1a}$=low while $Qn=\phi_2=\phi_{2a}$=high. Just after the RS flip-flop 204 is reset by U1, $C_1$ is disconnected from U1, and then rapidly charged back to VDD. In order to prevent the RS flipflop 204 from being reset erroneously by charging $C_1$ to VDD, AND1 decouples U1 from the RS flipflop 204 at the moment when $C_1$ is being charged to VDD. Note that this happens before the feedback of U1 is activated by $\phi_{2a}$. Therefore, any glitches that can be seen at the output of U1 during activation of U1's feedback are also decoupled from the RS flipflop. The negative feedback across U1 is activated, thus $v_{IN1-}(t)$ is driven to $V_{REF}+V_{OFF1}$ storing $V_{OFF1}$ into $C_3$; this corresponds to the initial assumption for $C_3$. The AND gate, AND1, hold its output low causing the RST input of the RS flip-flop 204 to be low again. Since $V_4$ has been charged to $V_{OFF2}$ during the previous state (i.e. the set state), $v_{IN2-}(t)$ is given by $v_{C2}(t)+V_{OFF2}$. Then U2 compares $v_{IN2-}(t)$ with the voltage at the non-inverting input, i.e. $V_{REF}+V_{OFF2}$. Both the inverting and non-inverting inputs of U2 have the term $V_{OFF2}$ causing $V_{OFF2}$ to be cancelled out during the comparison.

Once $v_{IN2-}(t)$ reaches $V_{REF}+V_{OFF2}$, U2 sets the RS flip-flop 204 again by asserting its output high. This completes one oscillation cycle.

Mathematically, $v_{C1}(t)$ during the RS flip-flop 204 being in the set state can be expressed as follows.

$$v_{C1}(t) = VDD - \frac{I_{SRC}}{C_1} \cdot t. \tag{6}$$

Therefore, $v_{IN1-}(t)$ during the set state becomes $$v_{IN1-}(t) = v_{C1}(t) + V_{C3}. \tag{7}$$

Since $v_{IN1-}(t)$ is compared with $V_{REF}+V_{OFF1}$, the time duration $\tau_H$ when the RS flip-flop 204 stays in the set state can be found to be $$\tau_H = \frac{C_1}{I_{SRC}}(VDD - V_{REF} + V_{C3} - V_{OFF1}). \tag{8}$$

The time duration $\tau_L$ when the RS flip-flop 204 stays in the reset state also can be found symmetrically to be $$\tau_L = \frac{C_2}{I_{SRC}}(VDD - V_{REF} + V_{C4} - V_{OFF2}). \tag{9}$$

Therefore, the oscillation period, $t_{OSC}$ becomes.

$$\begin{aligned} t_{OSC} &= \tau_H + \tau_L \\ &= \frac{VDD - V_{REF}}{I_{SRC}}(C_1 + C_2) + \frac{C_1}{I_{SRC}}(V_{C3} - V_{OFF1}) + \\ &\quad \frac{C_2}{I_{SRC}}(V_{C4} - V_{OFF2}). \end{aligned} \tag{10}$$

Since the $V_{C3}=V_{OFF1}$ and $V_{C4}=V_{OFF2}$, the second and the third term of (10) cancel out and thus we can write $t_{OSC}$ as follows.

$$t_{OSC} = \frac{VDD - V_{REF}}{I_{SRC}}(C_1 + C_2). \tag{11}$$

In equation (11), the dependency of the oscillation period on the input-offset voltage errors, $V_{OFF1}$ and $V_{OFF2}$ is cancelled out, advantageously providing cancelling of errors in the oscillation period due to comparator input-offset voltages in the example embodiment. As will be appreciated by a person skill in the art, this cancellation in the example embodiment does not require any external signals, thus addressing one of the problems in existing relaxation oscillators with automatic offset cancelling techniques based on switch-capacitors circuits requiring an additional clock signal.

Figure 10:
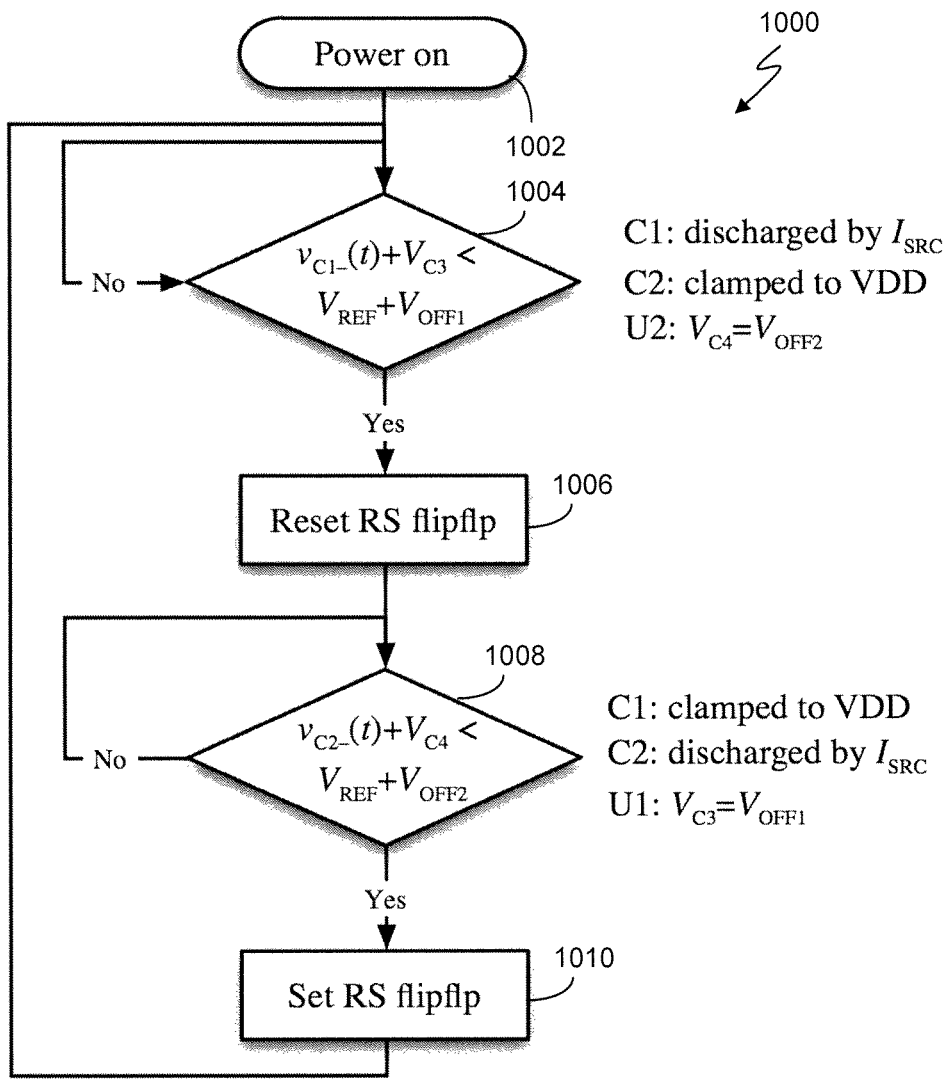
FIG. 10 shows a flowchart illustrating a method for the comparators to make transitions between the set stage and the reset stage depending on each capacitor's voltage, according to an example embodiment.

FIG. 10 shows a flowchart 1000 illustrating a method for offset cancellation in the relaxation oscillator 200 (FIG. 2), in this example embodiment. After power on at step 1002, C1 is discharged, C2 is clamped to VDD and at U2, $V_{C4}=V_{OFF2}$ during the cycle where the condition in step 1004 is not fulfilled. Once the condition in step 1004 is fulfilled, the RS flip flop is reset at step 1006. During the next cycle, where the condition in step 1008 is not fulfilled, C1 is clamped to VDD, C2 is discharged and at U1, $V_{C3}=V_{OFF1}$. Once the condition in step 1008 is fulfilled, the RS flip flop is set at step 1010, and the process loops back to step 1004.

It will be appreciated that the relaxation oscillator of example embodiments can be implemented utilizing readily available RC time reference on a CMOS fabrication process. The proposed relaxation oscillator 200 (FIG. 2) was simulated using a device model for 0.13-μm, 1.5V CMOS process and results were compared with those of a conventional relaxation oscillator. The reference capacitors, $C_1$ and $C_2$ are considered ideal in order to clearly see the effectiveness of the offset cancelling scheme in the example embodiment.

Figure 7:
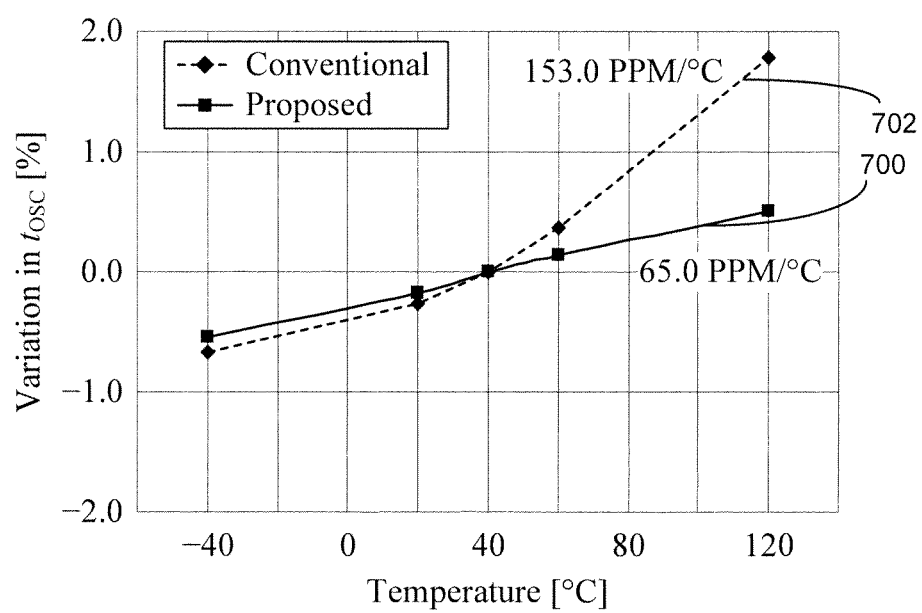
FIG. 7 is a diagram showing simulated results of variations in the oscillation period as a function of ambient temperature comparing a relaxation oscillator according to an example embodiment, and a conventional relaxation oscillator.
Figure 8:
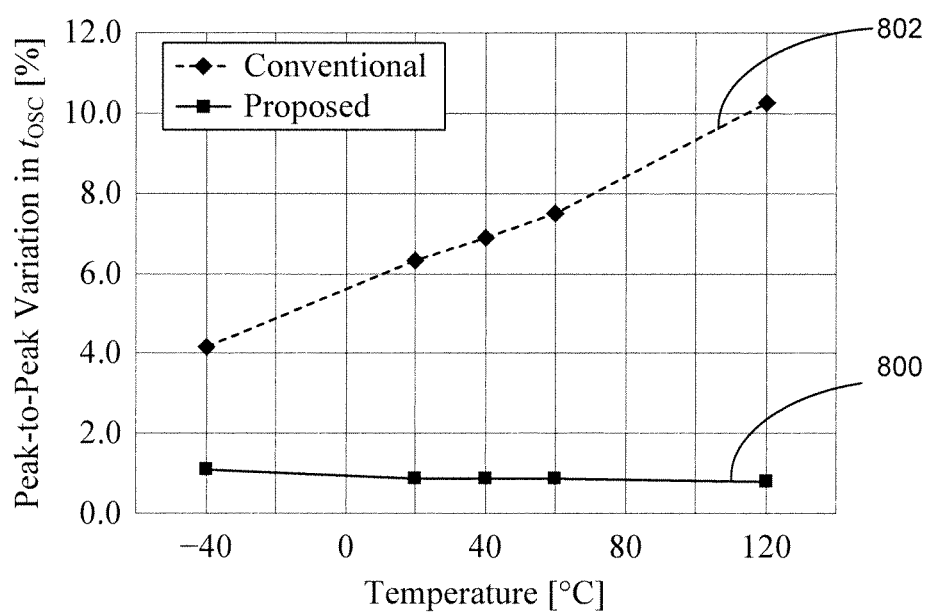
FIG. 8 is a graph showing peak-to-peak variations in the oscillation period as a result of process variation, as a function of temperature, comparing a relaxation oscillator according to an example embodiment, and a conventional relaxation oscillator.

FIG. 7 shows simulated results of variations in the oscillation period, $t_{OSC}$ as ambient temperature change. $t_{OSC}$ according to an example embodiment (curve 700) shows 65.0 PPM/° C. of sensitivity to temperature whereas the conventional relaxation oscillator (curve 702) has 153.0 PPM/° C. FIG. 8 shows peak-to-peak variations in the oscillation period for approximately 99.73% of possible process variation, as a function of temperature. The proposed oscillator (curve 800) shows approximately 1% of variation in oscillation period over the investigated temperature range, whereas the conventional oscillator (curve 802) shows >10% in the worst case.

Figure 9:
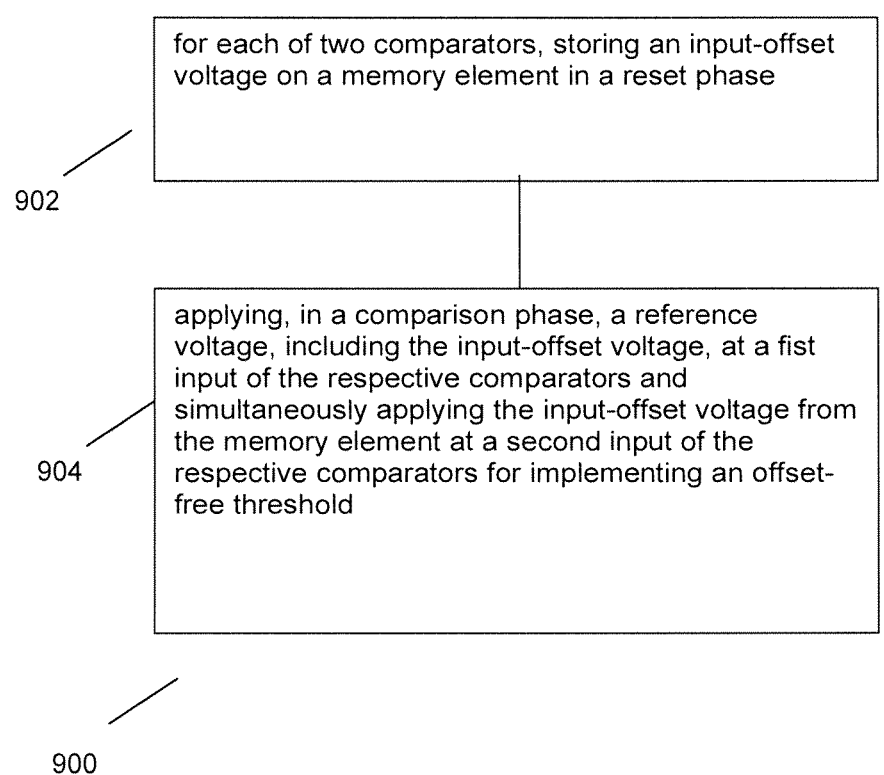
FIG. 9 shows a flowchart illustrating a method for offset cancellation in a relaxation oscillator, according to an example of embodiment.

FIG. 9 shows a flowchart 900 illustrating a method for offset cancellation in a relaxation oscillator, according to an example embodiment. At step 902, for each of two comparators, an input-offset voltage is stored on a memory element in a reset phase. At step 904, in a comparison stage, a reference voltage, including the input-offset voltage, is applied at a first input of the respective comparator and simultaneously the input-offset voltage from the memory element is applied at a second input of the respective comparator for implementing an offset-free threshold.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A relaxation oscillator comprising:
   two comparator units, each comparator unit comprising a comparator element and a memory element; and
   a switch control generator coupled to each of the comparator units;
   wherein each comparator unit, in a reset state, stores an input-offset voltage on the memory element under the control of the switch control generator such that, in a comparison state, the input-offset voltage is applied to both inputs of the comparator for implementing an offset-free threshold.

2. The oscillator of claim 1, wherein the memory elements comprise capacitors.

3. The oscillator of claim 1, wherein each comparator unit comprises an AND element coupled at respective inputs to an output of the comparator and to the switch control generator respectively, and at an output to a memory block; such that the output of the comparator is decoupled from an input of the memory block in the reset state, and coupled to the input of the memory block in the comparison state under the control of the switch signal generator.

4. The oscillator of claim 3, wherein the memory block provides clock signals to the switch control generator based on current states of the comparator units.

5. The oscillator of claim 4, wherein the memory block comprises an RS flip-flop.

6. The oscillator of claim 1, wherein each comparator comprises a feedback switchable under the control of the switch control generator such that the feedback is active in the reset state.

7. The oscillator of claim 1, wherein each comparator unit further comprises a switch coupled to the switch control generator, for charging of the memory element, from a reference voltage, including the input-offset voltage, in the reset state.

8. The oscillator of claim 1, wherein the switch control generator comprises a RS flip-flop with multiple delay stages along each feedback path.

9. A method for offset cancellation in a relaxation oscillator, the method comprising the steps of:
   for each of two comparators, storing an input-offset voltage on a memory element in a reset phase; and
   applying, in a comparison phase, a reference voltage, including the input-offset voltage, at a first input of the respective comparators and simultaneously applying the input-offset voltage from the memory element at a second input of the respective comparators for implementing an offset-free threshold.

10. The method of claim 9, further comprising decoupling an output of the respective comparators from an input of a memory block in the reset phase, and coupling the output to the input of the memory block in the comparison phase.

11. The method of claim 10, further comprising implementing a time delay between decoupling the output of the comparators from the input of the memory block, and entering the reset state for the respective comparators.

12. The method of claim 10, further comprising implementing a time delay between entering the comparison state for the respective comparators, and coupling the outputs of the respective comparators to the input of the memory block.

13. The method of claim 11, wherein the amount of delay is controlled by a selected number of delay stages in a switch control generator of the relaxation oscillator.

14. The method of claim 10, wherein the memory block provides clock signals for generating switch control signals based on current states of the comparators.

15. The method of claim 9, further comprising applying a feedback across the respective comparator in the reset phase.

16. The method of claim 9, comprising charging of the memory element from a reference voltage, including the input-offset voltage, in the reset state.

17. The oscillator of claim 1, wherein the switch control generator comprises a RS flip-flop with two delay stages along each feedback path.

\* \* \* \* \*